United States Patent
Mueller et al.

(10) Patent No.: US 9,620,359 B2
(45) Date of Patent: Apr. 11, 2017

(54) REACTIVE DEPLETION OF REACTOR DEPOSITS IN HARVESTING POLYCRYSTALLINE SILICON RODS

(71) Applicant: Wacker Chemie AG, Munich (DE)

(72) Inventors: Barbara Mueller, Burgkirchen (DE); Thomas Koch, Burghausen (DE)

(73) Assignee: Wacker Chemie AG, Munich (DE)

( * ) Notice: Subject to any disclaimer, the term of this patent is extended or adjusted under 35 U.S.C. 154(b) by 0 days.

(21) Appl. No.: 14/761,523

(22) PCT Filed: Jan. 13, 2014

(86) PCT No.: PCT/EP2014/050437
§ 371 (c)(1),
(2) Date: Jul. 16, 2015

(87) PCT Pub. No.: WO2014/111326
PCT Pub. Date: Jul. 24, 2014

(65) Prior Publication Data
US 2015/0364323 A1    Dec. 17, 2015

(30) Foreign Application Priority Data

Jan. 17, 2013    (DE) .................... 10 2013 200 660

(51) Int. Cl.
*C01B 33/035*      (2006.01)
*H01L 21/02*       (2006.01)

(52) U.S. Cl.
CPC ...... *H01L 21/02595* (2013.01); *C01B 33/035* (2013.01); *H01L 21/0262* (2013.01); *H01L 21/02532* (2013.01)

(58) Field of Classification Search
None
See application file for complete search history.

(56) References Cited

U.S. PATENT DOCUMENTS

| | | | |
|---|---|---|---|
| 3,491,720 A * | 1/1970 | Harris | ..................... C30B 25/08 118/719 |
| 7,927,571 B2 | 4/2011 | Altmann et al. | |
| 2008/0038178 A1* | 2/2008 | Altmann | ............... C01B 33/029 423/348 |
| 2009/0246113 A1 | 10/2009 | Endoh et al. | |
| 2010/0086466 A1* | 4/2010 | Ceran | ..................... C01B 33/03 423/349 |
| 2010/0272922 A1 | 10/2010 | Revankar et al. | |

(Continued)

FOREIGN PATENT DOCUMENTS

| | | |
|---|---|---|
| DE | 102006037020 A1 | 2/2008 |
| EP | 1 886 971 A1 | 2/2008 |
| EP | 2 077 252 A2 | 7/2009 |

(Continued)

*Primary Examiner* — Marc Armand
*Assistant Examiner* — Shannon Yi
(74) *Attorney, Agent, or Firm* — Brooks Kushman P.C.

(57) ABSTRACT

The Siemens process for deposition of polycrystalline silicon in the form of rods in a sealed reactor is improved by, after introduction of deposition gas has ceased, introducing a ventilating gas into the partially sealed reactor, withdrawing a gas stream from the reactor, and monitoring the components in the gas stream withdrawn until a desired concentration of one or more components is reached, and opening the reactor to remove the rods.

12 Claims, 4 Drawing Sheets

(56) References Cited

U.S. PATENT DOCUMENTS

2012/0100302 A1* 4/2012 Fabry .................... C01B 33/035
                                                                       427/534
2012/0237429 A1* 9/2012 Netsu .................... C01B 33/035
                                                                       423/349

FOREIGN PATENT DOCUMENTS

| | | |
|---|---|---|
| GB | 1 532 649 | 11/1978 |
| JP | 56114815 A | 9/1981 |
| JP | 2008-037748 A2 | 2/2008 |
| JP | 2009-256200 A2 | 11/2009 |

\* cited by examiner

REACTIVE DEPLETION OF REACTOR DEPOSITS IN HARVESTING POLYCRYSTALLINE SILICON RODS

CROSS REFERENCE TO RELATED APPLICATIONS

This application is the U.S. National Phase of PCT Appln. No. PCT/EP2014/050437 filed Jan. 13, 2014, which claims priority to German Application No. 10 2013 200 660.8 filed Jan. 17, 2013, the disclosures of which are incorporated in their entirety by reference herein.

BACKGROUND OF THE INVENTION

1. Field of the Invention

The invention relates to a process for depositing polycrystalline silicon.

2. Description of the Related Art

Polycrystalline silicon (polysilicon) serves as a starting material for production of monocrystalline silicon for semiconductors by the Czochralski (CZ) or zone melting (FZ) processes, and for production of mono- or polycrystalline silicon by various pulling and casting processes for production of solar cells for photovoltaics.

Polycrystalline silicon is generally produced batchwise in the Siemens process. This involves thermally decomposing a silicon-containing reaction gas or reducing it by means of hydrogen, and depositing it as high-purity silicon on thin filament rods of silicon, called "thin rods" or "cores".

The silicon-containing component of the reaction gas is generally monosilane or a halosilane of the general composition $SiH_nX_{4-n}$ (n=0, 1, 2, 3; X=Cl, Br, I). It is preferably a chlorosilane or chlorosilane mixture, more preferably trichlorosilane. Predominantly $SiH_4$ or $SiHCl_3$ (trichlorosilane, TCS) is used in a mixture with hydrogen.

The Siemens process is performed in a deposition reactor. EP 2 077 252 A2 describes the typical construction of a reactor type used in the production of polysilicon. In the most commonly used embodiment, the deposition reactor comprises a metallic base plate and a coolable bell jar placed onto the base plate so as to form a reaction space within the bell jar. The usually bell-shaped deposition reactor has to be closeable in a gas-tight manner since the reaction gases are corrosive and, in a mixture with air, have a tendency to self-ignition or to explosion. The base plate is provided with one or more feed orifices and one or more removal orifices for the gaseous reaction gases, and with holders which help to hold the thin rods in the reaction space. In general, two adjacent rods are connected by a bridge at their free ends, opposite the held foot ends, to form a U-shaped support body. The U-shaped support bodies are heated up to the deposition temperature by direct passage of current and the reaction gas is supplied.

A typical procedure for deposition of polysilicon involves opening a shutoff valve for the reaction gas flowing to the reactor and a shutoff valve for the offgas flowing out of the reactor. The reaction gas flows through a feed orifice in the base plate into the closed deposition reactor. The silicon is deposited therein on the thin rods heated by direct passage of current. The hot offgas formed in the reactor leaves the reactor through a removal orifice in the base plate and can then be subjected to a processing operation, for example a condensation, or can be sent to a scrubber.

In the deposition of silicon, the halogen-containing silicon compounds, for example trichlorosilane, decompose from the gas phase on the surface of the heated thin rods. In the course of this, the diameter of the thin rods grows. After the attainment of a desired diameter, the deposition is ended and the polysilicon rods formed are cooled to room temperature.

After cooling the rods, the bell jar is opened and the rods are withdrawn with deinstallation aids for further processing. Subsequently, the bell jar and base plate of the reactor are cleaned and provided with new electrodes and thin rods for the next deposition batch. After the bell jar has been closed, the process for depositing the next batch of polysilicon is again performed as described.

From the time of opening of the reactor until the deinstallation of the batch deposited, the polysilicon rods are in contact with ambient media such as room air with the corresponding constituents of nitrogen, oxygen, moisture, but also impurities in the form of extraneous constituents present in the air (metals, nonmetals, gases). The opening also causes a possible exchange of gas between the reactor interior and the deposition room. In this case, reactants, products or even constituents which have already reacted fully or partly (e.g. $HCl_{(g)}$) which remain in the reaction space after the deposition can enter into the ambient air through exchange of gas.

More particularly, this is the case for the penetration of moisture from the ambient air into the reactor. When moisture penetrates specifically into the feed and removal lines of the reactor, and when bell jar deposits are present (solids of main constituents remaining on the inside of the reactor after the deposition, containing the elements Si, Cl and O), halosilane residues, for example unconverted reaction gas, or halosilanes or polysilanes formed in the process, result in the formation of corrosive hydrogen halides, for example hydrogen chloride. These corrosive gases can escape from the deposition reactor into the production room and lead, for example, to corrosion on lines, fittings, and technical components therein.

Especially the hydrogen halide corrodes reactor components, including the feed and removal lines in the reactor. The corrosion process gives rise to damage in the form of rust formation on steel surfaces in, for example, components of the deposition plants (flanges, connections). The corrosion which has occurred firstly causes a change in the surface properties and, as a result, releases metal particles (for example steel and alloy constituents Fe, Cr, Ni, Mn, Zn, Ti, W), and also releases electrically active dopants such as boron, phosphorus, aluminum and arsenic. These substances are introduced into the silicon deposited to an increased degree in the subsequent deposition, particularly on commencement of deposition, and deposited on the rod surface of polysilicon rods present in the production space.

Particularly, corroded steel can lead to unwanted deposits on the rod surfaces when the deposition reactors are opened for batch changeover and deinstallation of the polycrystalline silicon rods. The release of, for example, iron and deposits thereof on the rod surface can lead to a reduction in the lifetime in the resulting product for the semiconductor or solar industry.

U.S. Pat. No. 7,927,571 (DE 102006037020 A1) discloses a method for the batch production of high purity polycrystalline silicon, in which an inert gas is fed through the supply line and the discharge line into the open reactor from the time when the deposition reactor is opened in order to extract the first substrate body with deposited silicon until the time when the reactor is closed in order to deposit silicon on the second substrate body.

GB 1532649 discloses a method of depositing polycrystalline silicon on a graphite surface, wherein the closed reactor is purged with an inert gas, for example argon, before commencement of the heating of the deposition surface or shortly before the deposition. This inert gas purging for purging of a closed reactor during the course of the process is effected for inertization or for avoidance of explosive gas mixtures (oxygen removal).

The feeding of inert gas into the reactor during the process or after the opening of the reactor, which is disclosed in the prior art, does not solve the problem of reactive depletion of the bell jar deposits. Nor is the problem of introduction of extraneous material into the reaction space and onto the rod surfaces in the operation of reactor opening remedied thereby.

US 2012/0100302 A1 discloses a method for producing polycrystalline silicon rods by deposition of silicon on at least one thin rod in a reactor, wherein, before the silicon deposition, hydrogen halide at a thin rod temperature of 400-1000° C. is introduced into the reactor containing at least one thin rod and is irradiated by means of UV light, as a result of which halogen and hydrogen radicals arise and the volatile halides and hydrides that form are removed from the reactor. This cleans the thin rod surface before the start of deposition. During the batch changeover or the installation of the thin rods, feed and removal lines and the bell jar are purged with inert gas (nitrogen) in the open state.

SUMMARY OF THE INVENTION

The problem addressed by the present invention was that of avoiding the disadvantages of the prior art. These and other problems are solved by a process for depositing polycrystalline silicon, comprising introducing a reaction gas comprising a silicon-containing component and hydrogen into a reactor, as a result of which polycrystalline silicon is deposited in the form of rods. In the process, the reactor, after the deposition has ended, is opened and ventilated for a particular period before rod deinstallation begins.

DETAILED DESCRIPTION OF THE PREFERRED EMBODIMENTS

Figure 1:
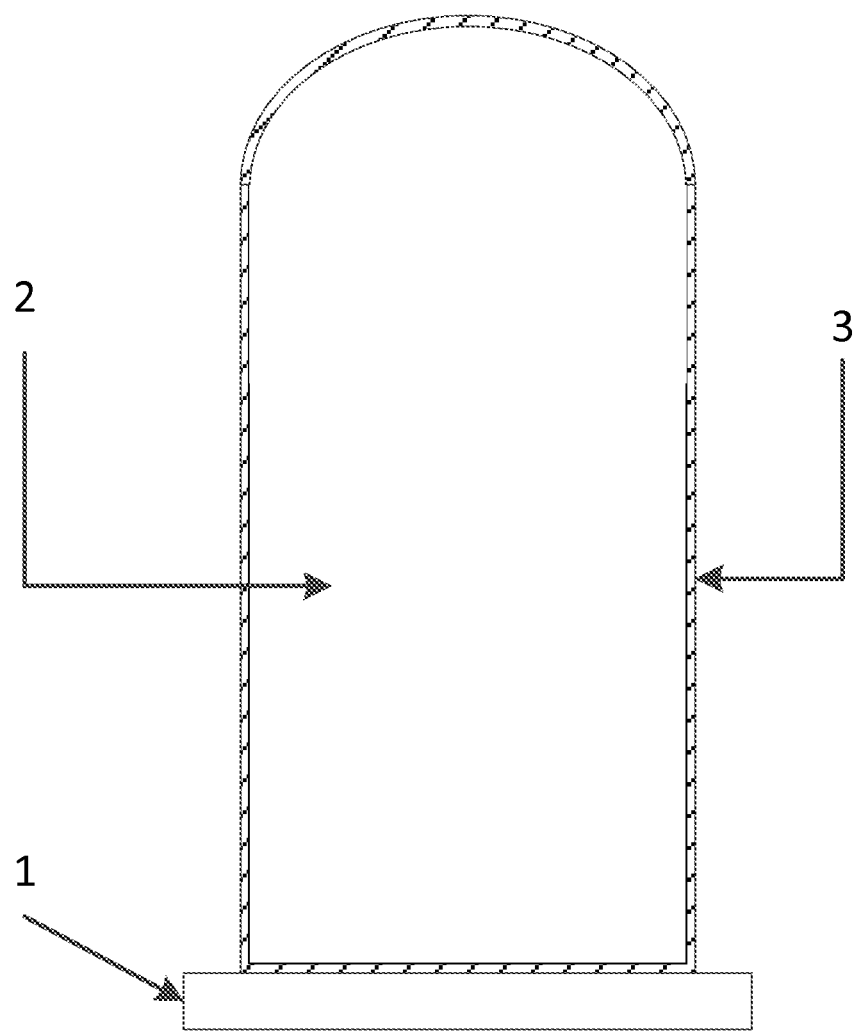
FIG. 1 illustrates a closed deposition reactor on a base plate.

The period of ventilation begins with the first opening of the reactor after the deposition of a batch of polycrystalline silicon and includes the period after the deposition has ended until the removal of the bell jar or parts thereof with the purpose of deinstalling the first polycrystalline rod from the reactor. In the case of rod deinstallation too, the system is opened and necessarily ventilated and purged.

Ending of the deposition is understood to mean that the rods have reached the desired final diameter and the supply of reaction gas is ended.

Typically, in a process for depositing polycrystalline silicon, a U-shaped support body composed of silicon is secured in an opened deposition reactor, the deposition reactor is sealed air-tight, the U-shaped support body is heated by direct passage of current, a silicon-containing reaction gas and hydrogen are introduced through a feed line into the deposition reactor, as a result of which silicon is deposited from the reaction gas on the support body. In the course of this, the diameter of the support body grows. This forms an offgas which is removed from the deposition reactor through a removal line. On attainment of a desired diameter of the support body, the deposition is ended, the support body is cooled to room temperature, the inner surface of the deposition reactor is opened to the environment and the support body is removed from the deposition reactor, with securing of a second U-shaped support body in the deposition reactor. In a departure from this, the invention envisages, from the attainment of the desired target diameter of the support body and ending of the deposition, conditioning of the reactor interior with gaseous, liquid and/or solid constituents present therein and of the bell jar deposits present therein, in a suitable manner under defined conditions, prior to complete opening of the deposition reactor for the purpose of rod deinstallation.

Preferably, the reactor is opened by raising the reactor bell jar above the base plate.

Preferably, the reactor is opened by opening a sightglass.

Preferably, the reactor is opened by opening a flange or input gas or offgas lines.

Preferably, a medium is fed into the reactor and then removed again during the opening of the reactor.

Preferably, the medium is fed in through a sightglass, the medium being removed again via offgas orifices or a second sightglass.

Preferably, the medium is fed in and removed through the same orifice.

Preferably, the medium fed in is air, nitrogen, moisture, in each case individually or in combination.

Preferably, the gases fed in and removed are monitored for discharged constituents resulting from the reactive depletion of the bell jar deposits.

Example 1

After ending the chemical reaction (the deposition), the deposition reactor is opened, so that the polysilicon rods can subsequently be deinstalled with low contamination from the deposition reactor.

For this purpose, the inner surface of the deposition reactor is opened under defined conditions. The inner surface of the deposition reactor includes the regions shown in FIG. 1.

FIG. 1 shows a closed deposition reactor 2 standing on a base plate 1. The inner surface comprises the surface 3 facing the interior of the reactor.

The inner surface of the deposition reactor can be opened at various points.

For example, the bell jar can be raised from the base plate, such that a medium for reactive depletion of the bell jar deposits can be supplied through the gap which forms.

Figure 2:
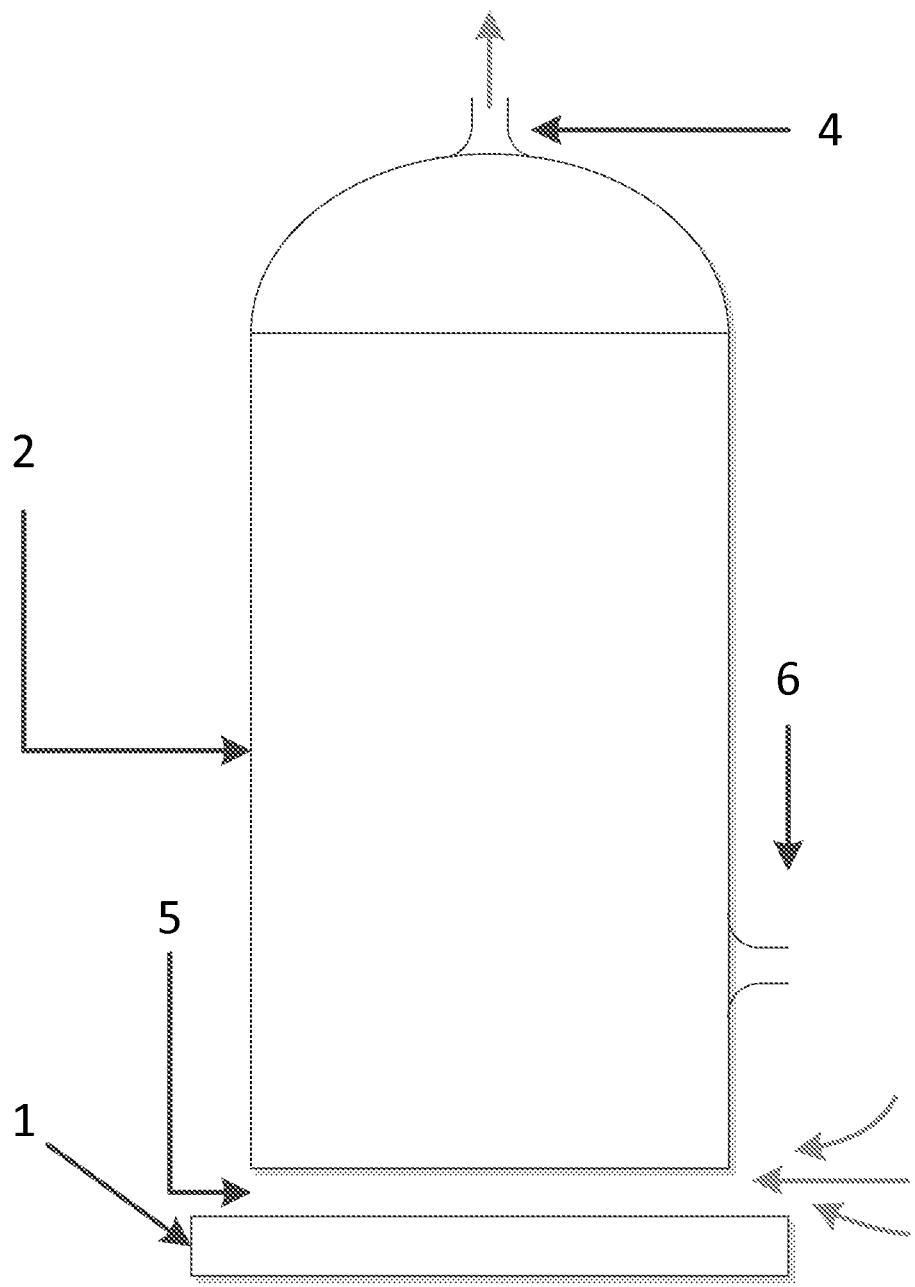
FIG. 2 illustrates a deposition reactor raised from the base plate during ventilation.

This procedure is shown in FIG. 2.

FIG. 2 shows a deposition reactor, with the bell jar 2 thereof (body and hood) raised from the base plate 1 in the course of ventilation.

Through the gap 5 which forms, a medium suitable for reactive depletion of the bell jar deposits is introduced, which is removed via the suction 4 or the sightglass 6.

This medium is gaseous and may contain different proportions of moisture at a defined temperature. For the reduction of the surface metal contamination of the deposited polysilicon rods, the gap height which forms and the ventilation period are important.

It has been found that there is a connection between surface metal contamination of the polysilicon rods and both the gap height and the ventilation time.

In this context, the following should be noted: the smaller the gap and the longer the airing time, the higher the surface metal contamination on the deposited polysilicon rods.

Between the base plate and bell jar of the deposition reactor, supports may be provided.

In this case, the gap which forms and is utilized for airing and media supply is, as a percentage, 0.5-15% of the total height of the deposition reactor (body+hood) above the base plate, preferably 0.9-11%, more preferably 1.2-9%.

The period for the process step of ventilation makes up less than one tenth of the process step of deposition, and the volume flow rate of the medium introduced is 50-2000 m³/h and preferably 100-500 m³/h, more preferably 150-300 m³/h.

Example 2

Figure 3:
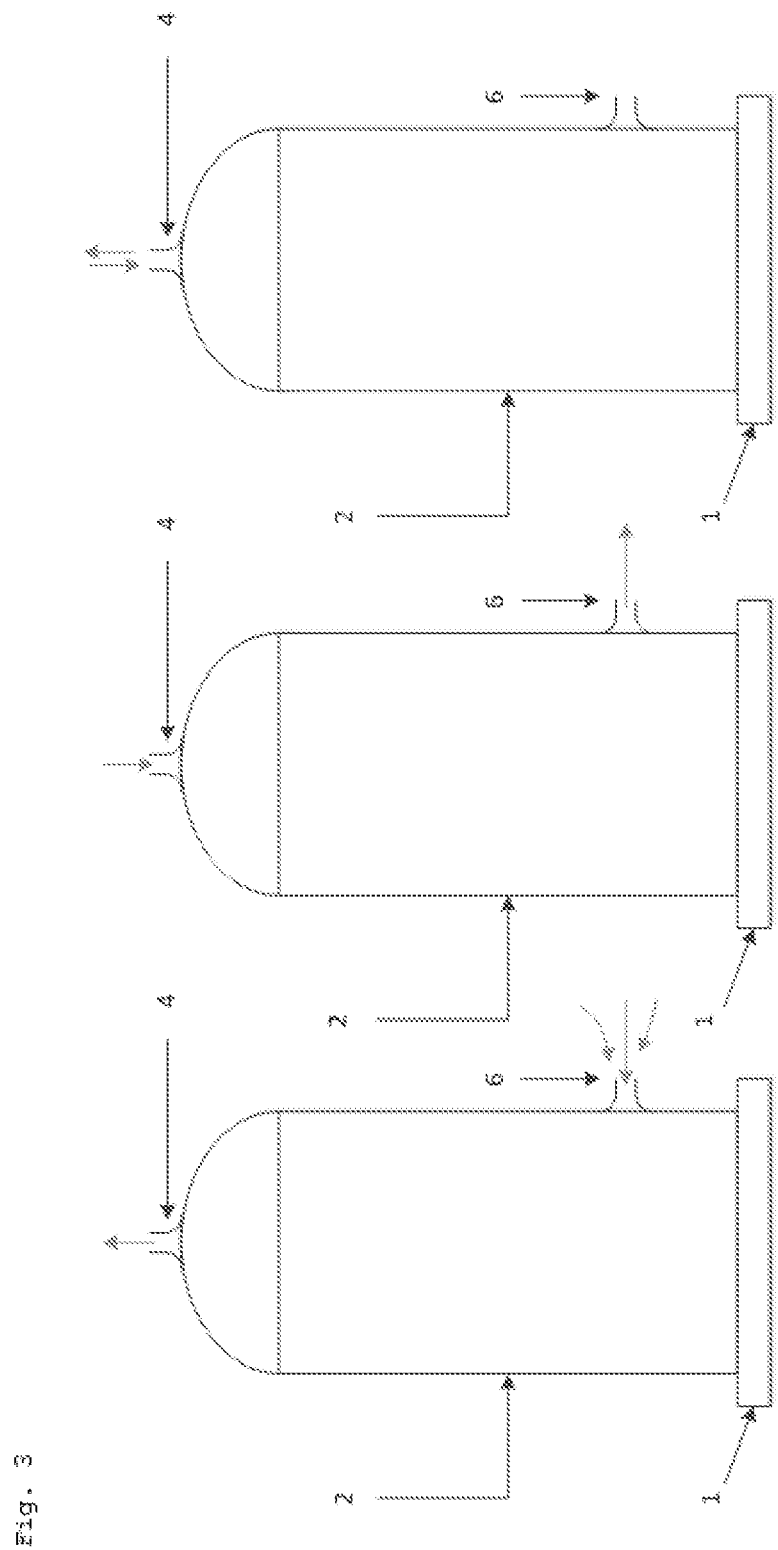
FIG. 3 illustrates means for ventilating a deposition reactor.

A second version of the process is shown in FIG. 3.

FIG. 3 shows means for ventilating the deposition plant before the batch changeover, namely through one or more sightglasses 6 or other orifices, for example flanges or water-cooled flanges and/or exclusively via the offgas orifice at the top 4. In this case, the bell jar 2 remains on the base plate 1.

In addition to the properties which have been described in the above version, the following changes are made:

A further means of opening can be effected in the region of the bell jar, without raising the deposition reactor from the base plate.

In this case, the extended means for ventilation of the deposition plant before the batch changeover involve ventilating the plant through one or more sightglasses 6 or other orifices, for example flanges or water-cooled flanges, and/or exclusively via the offgas orifice at the top 4. In this case, the bell jar 2 remains on the base plate 1.

One advantage of this method is that the bell jar deposits present in the reactor can be depleted by reaction under defined conditions.

The defined supply of media which serve for the reactive depletion of the bell jar deposits and discharge of $HCl_{[g]}$ is possible in a relatively simple manner.

Possible media include air, synthetic air, air-conditioning system air, nitrogen, argon, helium, protective gases etc.

The media used can, for example, be preconditioned by the controlled supply of moisture.

In this way, more exact regulation of the flow rate of the in- and out-flowing medium is also possible.

In this way, the period between the end of the deposition process and re-equipping of the deposition reactor with thin rods is minimized.

A further advantage is that the surface contamination of the polysilicon rods can be reduced through opening of the reactor and the use of filter units which are provided in the region of the open surface, and through the suitable selection of the medium supplied for ventilation.

Table 1 shows surface metal contamination of the polysilicon rods after ventilation of the deposition plant by raising the bell jar (Example 1) and through one of the sightglasses (Example 2).

The discharge of HCl [g] and further reaction products and of medium used for airing is performed through offgas orifices into the suction.

TABLE 1

| Metal | Example 1 Median [%]/Scatter 3σ | Example 2 Median [%]/Scatter 3σ |
| --- | --- | --- |
| Fe | 100 | 60 |
| Cr | 100 | 40 |
| Ni | 100 | 95 |
| Na | 100 | 32 |
| Zn | 100 | 22 |
| Al | 100 | 56 |
| Cu | 100 | 28 |
| Mg | 100 | 64 |
| Ti | 100 | 75 |
| W | 100 | 91 |
| K | 100 | 96 |
| Ca | 100 | 62 |
| Co | 100 | 78 |

Example 3

In a further version of the process, moistened nitrogen and/or air (including air in the form of air-conditioning air) is introduced into the deposition reactor as the medium for ventilating the deposition plant, and the reactive depletion of the bell jar deposits is monitored via the amount of hydrogen chloride gas formed by online monitoring, and the process is ended depending on a limiting concentration to be achieved.

Through the use of moistened nitrogen and/or air, the required process time for attainment of the required limiting concentration can be distinctly shortened up to a shortening of the ventilation time by a factor of 3.

Figure 4:
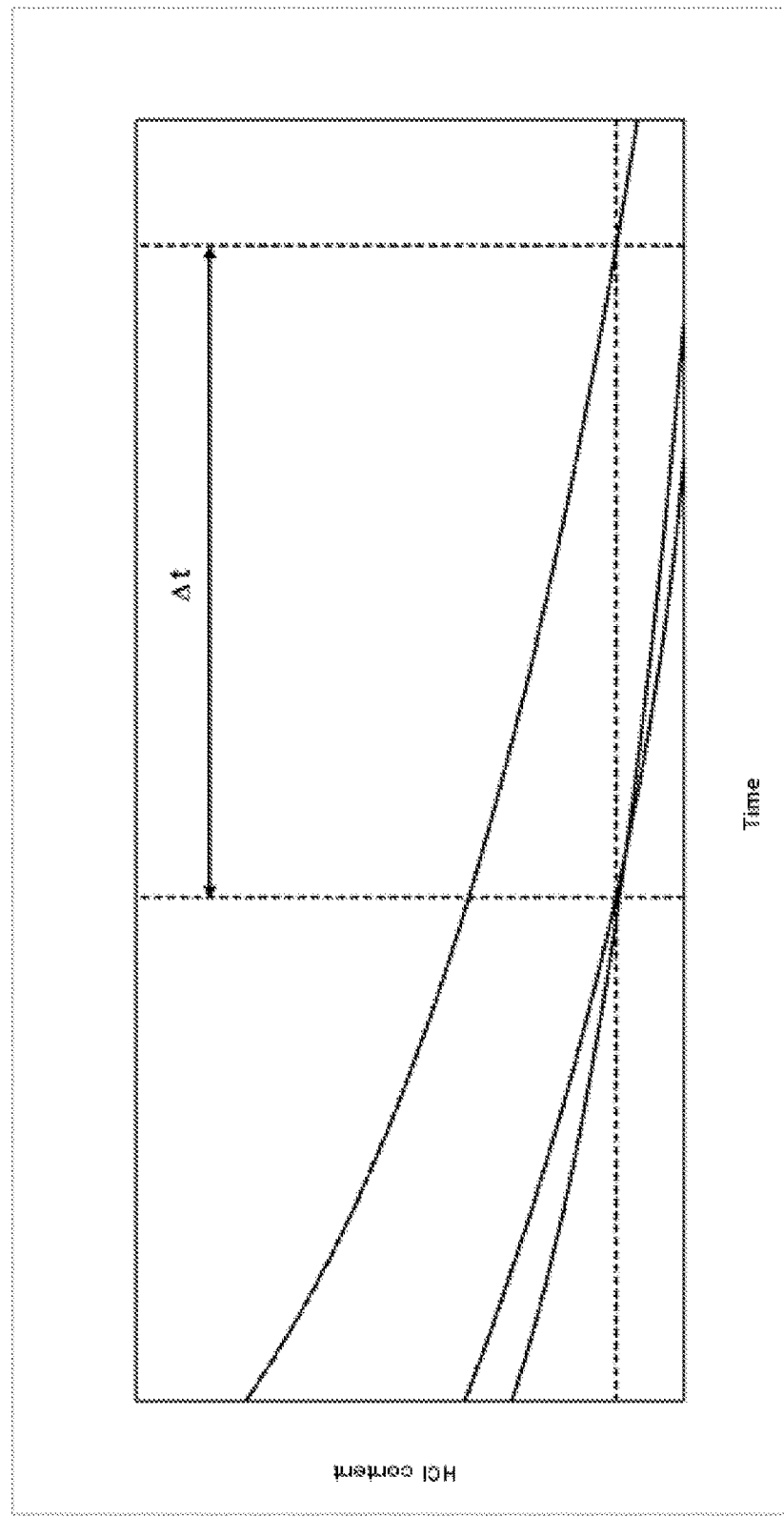
FIG. 4 illustrates the relationship between limiting concentration and initial HCl concentration.

The possible saving of process time is indicated in FIG. 4 by Δt.

Moreover, the ending of the process with respect to a target parameter is possible, and so the process step lasts only as long as required for technical purposes.

This situation is illustrated in the figure which follows.

FIG. 4 shows that different batches require different periods for attainment of the required limiting concentration depending on the initial hydrogen chloride concentration in the suction (as an indicator for the progress of the process step).

The time Δt can be saved through the use of an online monitoring system compared to the fixing of a particular fixed process run time.

This reduces the deposition-free time.

The desired protection comprises the process step of ventilating the deposition plants after the deposition time has ended and before the deinstallation of the polysilicon rods.

The invention claimed is:

1. A process for depositing polycrystalline silicon, comprising introducing a reaction gas comprising a silicon-containing component and hydrogen into a reactor positioned on a base plate, as a result of which polycrystalline silicon is deposited in the form of rods, wherein the reactor, after the deposition has ended, is partially opened and ventilated for a particular period prior to full opening and removal of the rods, wherein moistened nitrogen and/or air is introduced into the reactor as a medium for ventilating.

2. The process of claim 1, in which the reactor is opened by raising the reactor above the base plate.

3. The process of claim 1, wherein the reactor is opened by opening a sightglass.

4. The process of claim 1, wherein the reactor is opened by opening one or more of a flange, an input gas line or an offgas line.

5. The process of claim 1, wherein the medium is fed into the reactor and then removed again during the opening of the reactor.

6. The process of claim 1, wherein gases fed in and removed are monitored for discharged constituents resulting from the reactive depletion of bell jar deposits.

7. The process of claim 5, wherein the medium is fed in through a sightglass and the medium is removed again via offgas orifices or a second sightglass orifice.

8. The process of claim 5, wherein the medium is fed in and removed through the same orifice.

9. A process for depositing polycrystalline silicon, comprising introducing a reaction gas comprising a silicon-containing component and hydrogen into a reactor positioned on a base plate, as a result of which polycrystalline silicon is deposited in the form of rods, wherein the reactor, after the deposition has ended and before rod deinstallation begins, is partially opened and ventilated with a gaseous medium for a period of time prior to complete opening of the reactor by raising the reactor bell jar above the base plate, wherein a gap which forms between the reactor and base plate and is utilized for ventilation and media supply is, as a percentage, 0.5-15% of the total height of the reactor above the base plate, wherein through the gap, a gaseous medium is introduced and then removed via suction or a sightglass, wherein the time period for ventilation is less than one tenth of the time of the process step of deposition, and the volume flow rate of the gaseous medium introduced is 50-2000 m$^3$/h, wherein moistened nitrogen and/or air is introduced into the reactor as the gaseous medium for ventilation.

10. The process of claim 9, wherein between the base plate and the bell jar supports are provided.

11. The process of claim 9, wherein a reactive depletion of bell jar deposits is monitored by online monitoring of an amount of hydrogen chloride gas formed by reaction of reactor deposits with the moisture of the gaseous medium, and the ventilation is ended depending on a limiting concentration to be achieved.

12. The process of claim 9, wherein the period for ventilation begins with the partial opening of the reactor after the deposition of a batch of polycrystalline silicon and includes the period after the deposition has ended, when the rods have reached the desired final diameter, until the removal of the bell jar or parts thereof for the purpose of deinstalling the first polycrystalline rod from the reactor.

* * * * *